(12) United States Patent
Kim et al.

(10) Patent No.: US 8,476,135 B2
(45) Date of Patent: Jul. 2, 2013

(54) INTEGRATED CIRCUIT PACKAGING SYSTEM WITH VERTICAL INTERCONNECTS AND METHOD OF MANUFACTURE THEREOF

(75) Inventors: JinGwan Kim, Seoul (KR); Hyunil Bae, Nonsan-si (KR)

(73) Assignee: Stats Chippac Ltd., Singapore (SG)

( * ) Notice: Subject to any disclaimer, the term of this patent is extended or adjusted under 35 U.S.C. 154(b) by 137 days.

(21) Appl. No.: 13/118,310

(22) Filed: May 27, 2011

(65) Prior Publication Data

US 2012/0299168 A1    Nov. 29, 2012

(51) Int. Cl.
*H01L 21/336* (2006.01)

(52) U.S. Cl.
USPC ........... 438/270; 438/618; 438/106; 438/597; 257/E21.499; 257/E21.502; 257/E21.503; 257/E21.505; 257/E21.509; 257/E21.511; 257/E21.585

(58) Field of Classification Search
USPC ............... 438/106, 107, 108, 112, 124, 127, 438/119, 270, 597, 618; 257/686, 777, E21.499, 257/E21.502, E21.503, E21.505, E21.509, 257/E21.511, E21.585

See application file for complete search history.

(56) References Cited

U.S. PATENT DOCUMENTS

| | | | |
|---|---|---|---|
| 6,847,109 B2 | 1/2005 | Shim | |
| 7,185,426 B1 | 3/2007 | Hiner et al. | |
| 7,667,338 B2 | 2/2010 | Lin et al. | |
| 7,863,755 B2 | 1/2011 | Lee et al. | |
| 2010/0207262 A1 | 8/2010 | Park et al. | |
| 2012/0286432 A1* | 11/2012 | Do et al. | 257/777 |

* cited by examiner

*Primary Examiner* — David Nhu
(74) *Attorney, Agent, or Firm* — Ishimaru & Associates LLP; I-Chang John Yang (57) ABSTRACT

A method of manufacture of an integrated circuit packaging system includes: providing a base carrier having a base carrier hole from a base carrier interconnection side to a base carrier device side; mounting a base integrated circuit over the base carrier; forming an encapsulation over the base carrier covering the base integrated circuit, the encapsulation having an encapsulation top side and having an encapsulation hole directly over the base carrier hole; and forming an interconnection structure as a single integral structure through the base carrier hole and the encapsulation hole, the interconnection structure directly on the encapsulation top side and directly on the base carrier interconnection side.

20 Claims, 5 Drawing Sheets

INTEGRATED CIRCUIT PACKAGING SYSTEM WITH VERTICAL INTERCONNECTS AND METHOD OF MANUFACTURE THEREOF

TECHNICAL FIELD

The present invention relates generally to an integrated circuit packaging system, and more particularly to a system for an integrated circuit packaging system with interconnects.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base carrier having a base carrier hole from a base carrier interconnection side to a base carrier device side; mounting a base integrated circuit over the base carrier; forming an encapsulation over the base carrier covering the base integrated circuit, the encapsulation having an encapsulation top side and having an encapsulation hole directly over the base carrier hole; and forming an interconnection structure as a single integral structure through the base carrier hole and the encapsulation hole, the interconnection structure directly on the encapsulation top side and directly on the base carrier interconnection side.

The present invention provides an integrated circuit packaging system, including: a base carrier having a base carrier hole from a base carrier interconnection side to a base carrier device side; a base integrated circuit over the base carrier; an encapsulation over the base carrier covering the base integrated circuit, the encapsulation having an encapsulation top side and having an encapsulation hole directly over the base carrier hole; and an interconnection structure as a single integral structure through the base carrier hole and the encapsulation hole, the interconnection structure directly on the encapsulation top side and directly on the base carrier interconnection side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Current molded laser package-on-package (MLP) packages require laser ablation and additional multiple processes accordingly. Such processes produce problems with undesirable contamination. Embodiments of the present invention provide answers or solutions to the problems.

Figure 1:
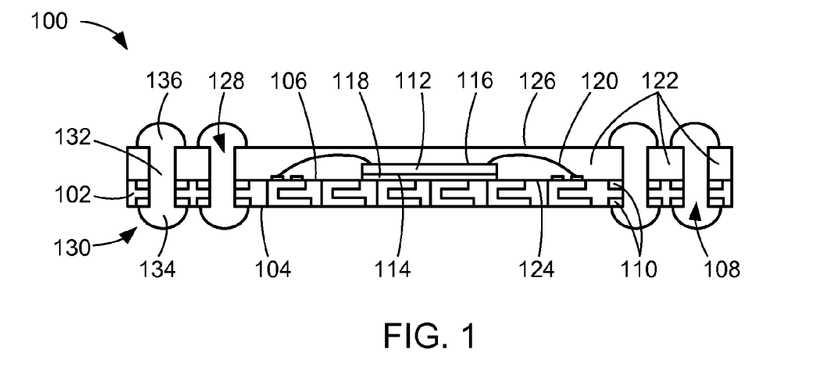
FIG. 1 is a cross-sectional view of an integrated circuit packaging system taken along line 1-1 of FIG. 2 in an embodiment of the present invention.
Figure 2:
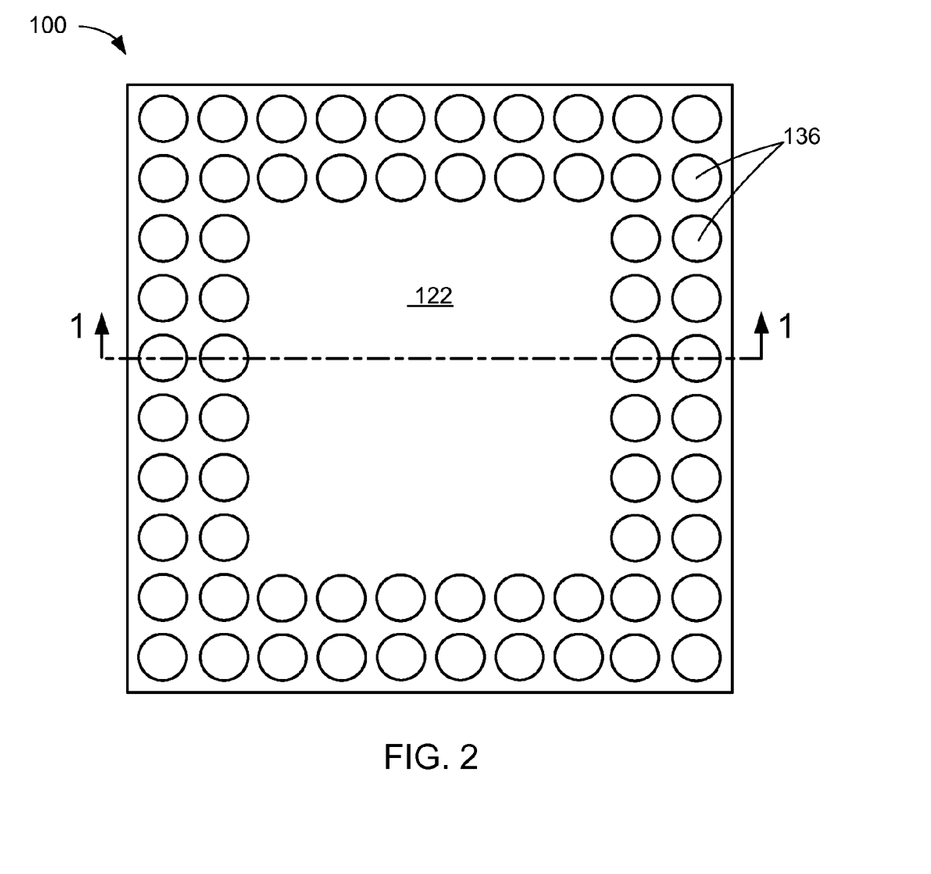
FIG. 2 is a top view of the integrated circuit packaging system.

Referring now to FIG. 1, therein is shown a cross-sectional view of an integrated circuit packaging system 100 taken along line 1-1 of FIG. 2 in an embodiment of the present invention. The integrated circuit packaging system 100 can represent a package level through hole interconnection for package-on-package (PoP). The integrated circuit packaging system 100 can include a package-on-package (PoP) stack structure.

The integrated circuit packaging system 100 can include a base carrier 102, which is defined as a support structure for mounting and connecting a semiconductor device thereto including providing electrical connections through the support structure. As an example, the base carrier 102 can represent a support structure including a multi-layer support structure including a printed circuit board (PCB), a laminated substrate, or a ceramic substrate.

The base carrier 102 can include a base carrier interconnection side 104 and a base carrier device side 106 opposite the base carrier interconnection side 104. The base carrier interconnection side 104 and the base carrier device side 106 are defined as horizontal surfaces of the base carrier 102, having opposite orientation, that are connected to an external system (not shown) and a semiconductor device, respectively.

The base carrier 102 can include a base carrier hole 108, which is defined as a through opening in the base carrier 102, from the base carrier interconnection side 104 to the base carrier device side 106. For example, the base carrier hole 108 can represent a hole in a printed circuit board (PCB).

The base carrier 102 can include base carrier pads 110, which are defined as electrically conductive contacts. The base carrier pads 110 provide attachment sites to electrically connect the base carrier 102 to a semiconductor device, a semiconductor package, or the external system. The base carrier pads 110 can be provided at the base carrier interconnection side 104 and the base carrier device side 106.

The integrated circuit packaging system 100 can include a base integrated circuit 112, which is defined as a semiconductor device having a number of integrated transistors interconnected to form active circuits. For example, the base integrated circuit 112 can represent a semiconductor device including an integrated circuit die, a wirebond integrated circuit, or a flip chip.

The base integrated circuit 112 can include a base inactive side 114 and a base active side 116 opposite the base inactive side 114. The base active side 116 is defined as a side of the base integrated circuit 112 having active circuitry fabricated thereon or having elements for connection to the active circuitry within the base integrated circuit 112.

The integrated circuit packaging system 100 can include a base attach layer 118, which is defined as a structure for holding a semiconductor device to a carrier. For example, the base attach layer 118 can be a die attach material or an adhesive material. The base attach layer 118 can be attached to the base carrier device side 106 and the base inactive side 114.

The integrated circuit packaging system 100 can include a base connector 120, which is defined as an electrically conductive connector. The base connector 120 can be coupled or attached to the base carrier device side 106 and the base active side 116.

The integrated circuit packaging system 100 can include an encapsulation 122, which is defined as a package cover of a semiconductor package to seal a semiconductor device providing mechanical and environmental protection. The encapsulation 122 can be formed over and covering the base carrier device side 106, the base integrated circuit 112, the base attach layer 118, and the base connector 120.

The encapsulation 122 can include an encapsulation bottom side 124 and an encapsulation top side 126 opposite the encapsulation bottom side 124. The encapsulation bottom side 124 and the encapsulation top side 126 are defined as horizontal surfaces of the encapsulation 122.

The encapsulation 122 can include an encapsulation hole 128, which is defined as a through opening in the encapsulation 122, from the encapsulation bottom side 124 to the encapsulation top side 126. The encapsulation hole 128 can be directly over as well as concentric with and larger than the base carrier hole 108. For example, the encapsulation hole 128 can represent a mold cavity or a package level through hole.

The integrated circuit packaging system 100 can include an interconnection structure 130, which is defined as an electrically conductive structure for mounting and connection purposes. The interconnection structure 130 provides electrical connection between the base integrated circuit 112 and the external system or between the integrated circuit packaging system 100 and a stack semiconductor package. The electrical connection is provided with the interconnection structure 130 electrically connected to the base carrier 102.

The interconnection structure 130 can include a single integral structure having a structure central portion 132, a structure bottom terminal 134, and a structure top terminal 136. The single integral structure is defined as an electrically conductive structure with a common material and as a solid structure. The single integral structure can include a homogeneous or uniform density.

The structure central portion 132 is defined as a vertical region of the interconnection structure 130 that is integrally connected to the structure bottom terminal 134 and the structure top terminal 136. The structure bottom terminal 134 and the structure top terminal 136 are defined as bottom and top portions, respectively, of the interconnection structure 130. The structure bottom terminal 134 and the structure top terminal 136 are extruded from the base carrier 102 and the encapsulation 122, respectively, for subsequent package stacking and electrical connection.

The structure central portion 132 is integrally formed with the structure bottom terminal 134 extending from and directly below the structure central portion 132, and the structure top terminal 136 extending from and directly above the structure central portion 132. The structure central portion 132 can be formed within or through the base carrier hole 108 and the encapsulation hole 128.

The structure bottom terminal 134 can extend from or below the base carrier interconnection side 104. A portion of the structure bottom terminal 134 can be directly on and electrically coupled to one of the base carrier pads 110 at the base carrier interconnection side 104.

The structure top terminal 136 can extend from or above the encapsulation top side 126. A portion of the structure top terminal 136 can be directly on the encapsulation top side 126.

It has been discovered that the interconnection structure 130 having the single integral structure with the structure central portion 132, the structure bottom terminal 134, and the structure top terminal 136 eliminate contamination and thus environmentally friendly with a simple process for molded package-on-package (PoP) packages compared to molded laser package-on-package (MLP) packages, which require multiple and separate processes to form top and bottom terminals producing undesirable by-product like dust.

It has been unexpectedly found that the structure central portion 132 with a robust vertical structure through the base carrier hole 108 and the encapsulation hole 128 provide structural integrity resulting in improved reliability.

It has been unexpectedly determined that the interconnection structure 130 having the structure central portion 132, the structure bottom terminal 134, and the structure top terminal 136 provides ball pad pitch reduction and thus overall package size reduction.

It has been unexpectedly recognized that the structure bottom terminal 134 and the structure top terminal 136 integral to the structure central portion 132 improves electrical performance with less propagation delay by achieving direct interconnection between one of the base carrier pads 110 at the base carrier interconnection side 104 and another of the base carrier pads 110 at the base carrier device side 106 without additional processes to form via on pad or dog-bone patterns in substrate fabrication.

Referring now to FIG. 2, therein is shown a top view of the integrated circuit packaging system 100. The top view depicts the structure top terminal 136 exposed from the encapsulation 122. A number of the structure top terminal 136 can be formed in multiple rows. A peripheral array of a number of the structure top terminal 136 can be adjacent a perimeter of the encapsulation 122.

Figures 3, 4:
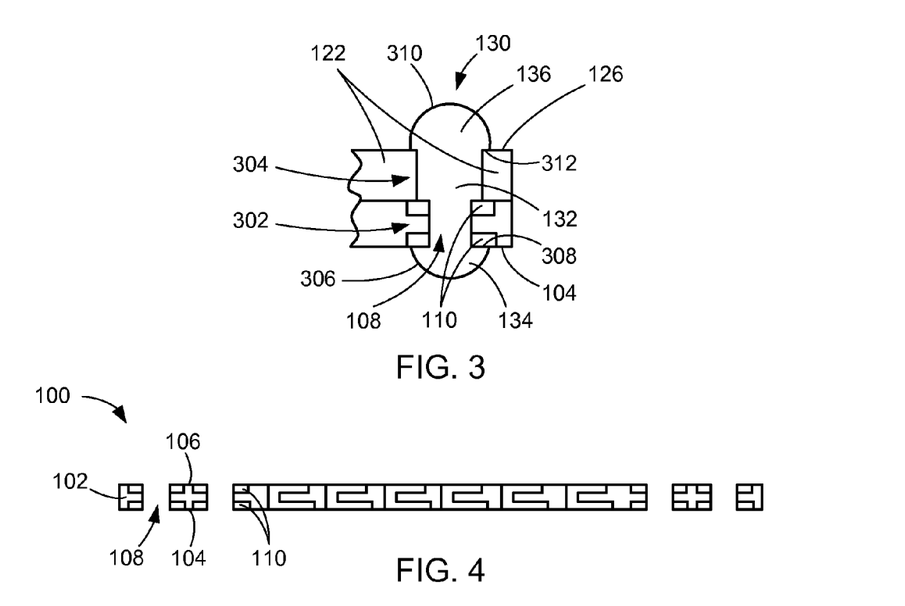
FIG. 3 is a detailed view of the interconnection structure.
FIG. 4 is a cross-sectional view of the integrated circuit packaging system in a carrier-providing phase of manufacture.

Referring now to FIG. 3, therein is shown a detailed view of the interconnection structure 130. The interconnection structure 130 can include the structure central portion 132 having a structure lower portion 302 and a structure internal portion 304, which are defined as bottom and middle regions of the structure central portion 132 that are integrally formed.

The structure lower portion 302 and the structure internal portion 304 are electrically connected to the structure bottom terminal 134 and the structure top terminal 136, as a single integral conductive structure. The structure internal portion 304 can include a horizontal width greater than a horizontal width of the structure lower portion 302. The structure lower portion 302 can be through or within the base carrier hole 108.

The structure bottom terminal 134 can include a bottom terminal external surface 306, which is defined as a bottom side of the structure bottom terminal 134, extending below the base carrier interconnection side 104. The bottom terminal external surface 306 can include a curve surface, characteristic of the surface tension formed ball or dome of the conductive material. For example, the bottom terminal external surface 306 can include a convex surface.

The structure bottom terminal 134 can include a bottom terminal planar side 308, which is defined as a side of the structure bottom terminal 134 that is connected to the bottom terminal external surface 306 and a non-horizontal side of the structure lower portion 302. The bottom terminal planar side 308 can include a non-vertical surface. The bottom terminal planar side 308 can be directly on one of the base carrier pads 110 at the base carrier interconnection side 104.

The structure top terminal 136 can include a top terminal external surface 310, which is defined as a top side of the structure top terminal 136, extending above the encapsulation top side 126. The top terminal external surface 310 can include a curve surface, characteristic of the surface tension formed ball or dome of the conductive material. For example, the top terminal external surface 310 can include a convex surface.

The structure top terminal 136 can include a top terminal planar side 312, which is defined as a side of the structure top terminal 136 that is connected to the top terminal external surface 310 and a non-horizontal side of the structure internal portion 304. The top terminal planar side 312 can include a non-vertical surface. The top terminal planar side 312 can be directly on the encapsulation top side 126.

For illustration purposes, the bottom terminal external surface 306 and the top terminal external surface 310 are shown with curve surfaces, although it is understood that the bottom terminal external surface 306 and the top terminal external surface 310 can include any surfaces. For example, the bottom terminal external surface 306 or the top terminal external surface 310 can include a planar surface.

It has been unexpectedly ascertained that the structure internal portion 304 having a horizontal width greater than a horizontal width of the structure lower portion 302 provides structural rigidity as well as eliminates mold bleeding into the base carrier hole 108 in the formation of the encapsulation 122.

It has been unexpectedly identified that the structure bottom terminal 134 and the structure top terminal 136 having vertical heights less than heights or diameters of solder balls on top pads of current package-on-package (PoP) packages provide package height profile reduction, thereby providing solutions for package size and height requirements in technology for package stack or package-on-package (PoP).

Referring now to FIG. 4, therein is shown a cross-sectional view of the integrated circuit packaging system 100 in a carrier-providing phase of manufacture. The integrated circuit packaging system 100 can include the base carrier 102.

The base carrier 102 can be provided with the base carrier hole 108 through the base carrier interconnection side 104 and the base carrier device side 106. For example, the base carrier hole 108 can represent a package through hole (PTH) on or through terminal pads, depicted as the base carrier pads 110.

Figure 5:
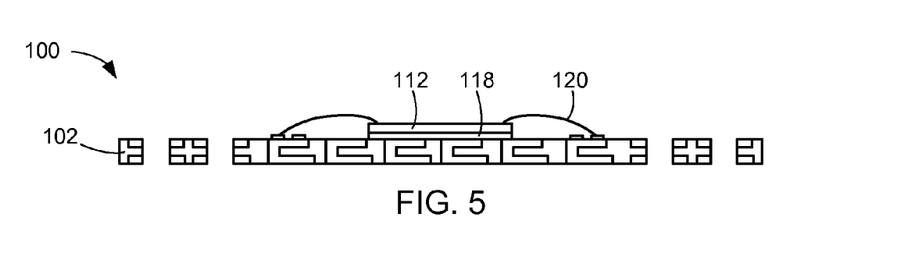
FIG. 5 is the structure of FIG. 4 in an attaching phase.

Referring now to FIG. 5, therein is shown the structure of FIG. 4 in an attaching phase. The attaching phase can include a device attachment process to mount the base integrated circuit 112 over the base carrier 102. The base integrated circuit 112 can be attached to the base carrier 102 with the base attach layer 118. For example, the device attachment process can include a die attach process.

The attaching phase can include a connection attachment process to electrically connect or attach the base integrated circuit 112 to the base carrier 102 with the base connector 120. For example, the connection attachment process can include a wire bonding process.

For illustrative purposes, the base connector 120 is shown as a bond wire, although it is understood that the base connector 120 can represent any electrically conductive connector. For example, the base connector 120 can represent an electrically conductive connector including a conductive ball, a conductive stud, or a conductive column.

Figure 6:
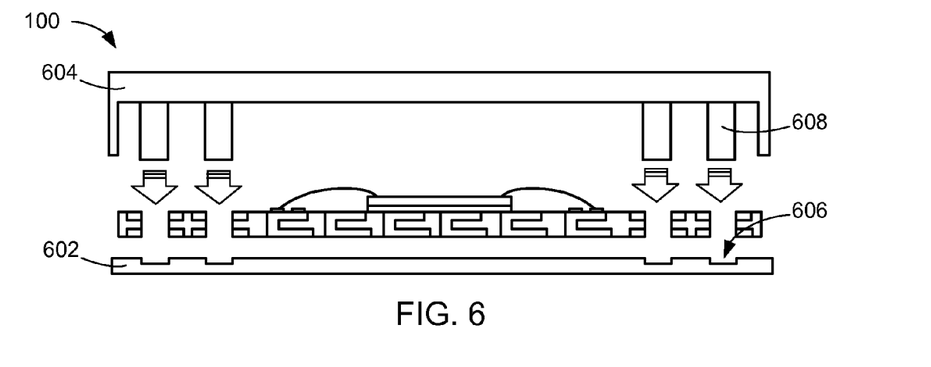
FIG. 6 is the structure of FIG. 5 in a chase-providing phase.

Referring now to FIG. 6, therein is shown the structure of FIG. 5 in a chase-providing phase. The integrated circuit packaging system 100 can include a mold base 602 and a mold chase 604 to form the encapsulation 122 of FIG. 1 in a subsequent phase. The mold base 602 can include a recess 606 to provide spacing for a pin 608 of the mold chase 604 to be inserted for secure attachment of the mold chase 604 to the mold base 602 in a subsequent phase.

Figure 7:
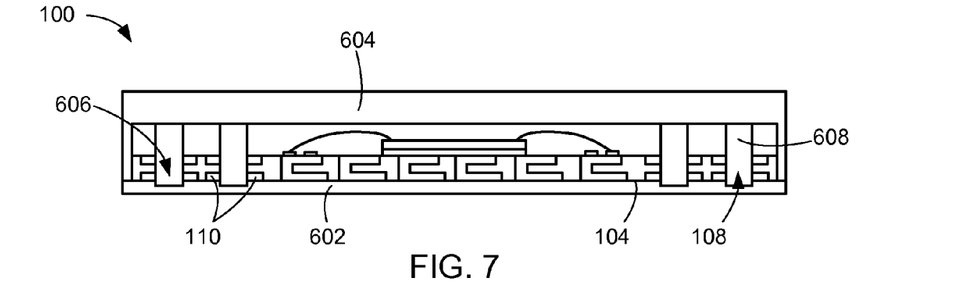
FIG. 7 is the structure of FIG. 6 in a chase engagement phase.

Referring now to FIG. 7, therein is shown the structure of FIG. 6 in a chase engagement phase. The pin 608 can be inserted through the base carrier hole 108 and into the recess 606 to form or cast the encapsulation 122 of FIG. 1 with a package hole, shown as the encapsulation hole 128 of FIG. 1, in a subsequent phase. Secure attachment of the pin 608 inserted into the recess 606 can protect the base carrier pads 110 and annular ring of package through hole (PTH), shown as the base carrier hole 108 at the base carrier interconnection side 104, in the formation of the encapsulation 122.

It has been unexpectedly observed that the mold base 602 having the recess 606 improves reliability by providing secure attachment between the mold base 602 and the mold chase 604 as well as providing protection to the base carrier pads 110 in the formation of the encapsulation 122 in order to provide reliable electrical connection in a subsequent phase to form the interconnection structure 130 of FIG. 1.

Figure 8:
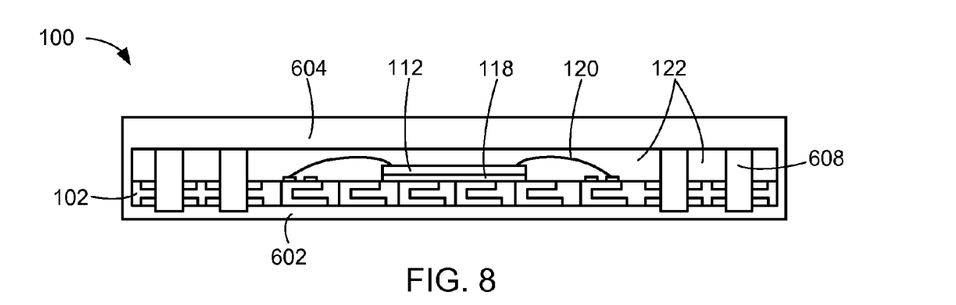
FIG. 8 is the structure of FIG. 7 in a molding phase.

Referring now to FIG. 8, therein is shown the structure of FIG. 7 in a molding phase. The encapsulation 122 can be formed between the mold base 602 and the mold chase 604. The encapsulation 122 can be formed surrounding the pin 608.

The encapsulation 122 can be formed over and covering the base carrier 102, the base integrated circuit 112, the base attach layer 118, and the base connector 120. For example, the encapsulation 122 can be formed with a molding material including an epoxy mold compound (EMC), plastic, ceramic, or any encapsulant.

Figure 9:
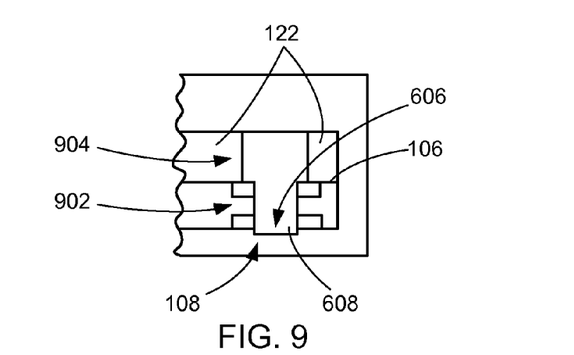
FIG. 9 is a detailed view of the pin.

Referring now to FIG. 9, therein is shown a detailed view of the pin 608. The pin 608 can include a pin lower portion 902 and a pin upper portion 904, which are defined as bottom and top regions of the pin 608.

The pin lower portion 902 can be inserted through the base carrier hole 108 and into the recess 606. The pin upper portion 904 can be over the base carrier device side 106. The pin upper portion 904 can include a horizontal width greater than a horizontal width of the pin lower portion 902 to form the structure internal portion 304 of FIG. 3 having a horizontal width greater than a horizontal width of the structure lower portion 302 of FIG. 3. Such design of a horizontal width of the pin upper portion 904 can constrain or prevent the molding material from bleeding into the base carrier hole 108.

It has been unexpectedly detected that the pin 608 having a step shape with the pin upper portion 904 having a horizontal width greater than a horizontal width of the pin lower portion 902 provides the structure central portion 132 of FIG. 1 having structural rigidity as well as eliminates mold bleeding into the base carrier hole 108 in the formation of the encapsulation 122.

Figure 10:
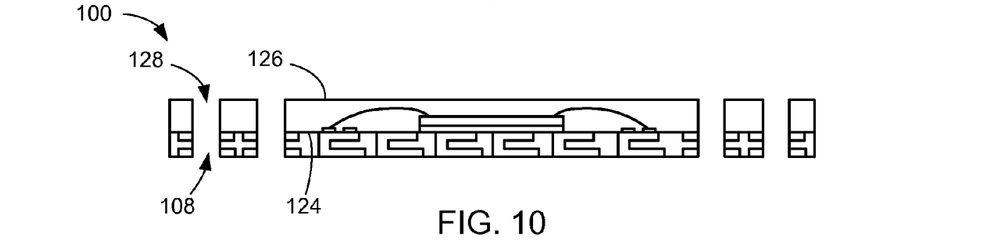
FIG. 10 is the structure of FIG. 8 in a chase disengagement phase.

Referring now to FIG. 10, therein is shown the structure of FIG. 8 in a chase disengagement phase. The chase disengagement phase can be executed or performed in a package preparation phase.

The mold chase 604 of FIG. 8 can be disengaged or released from the mold base 602 of FIG. 8 leaving the encapsulation hole 128 through the encapsulation bottom side 124 and the encapsulation top side 126. The encapsulation hole 128 can be directly above the base carrier hole 108.

It has been further discovered that the strength of a molded package with the encapsulation hole 128 is superior to a package with a drilled hole version. The molded package is less susceptible to chipping and cracking than the package with the drilled hole version.

Figure 11:
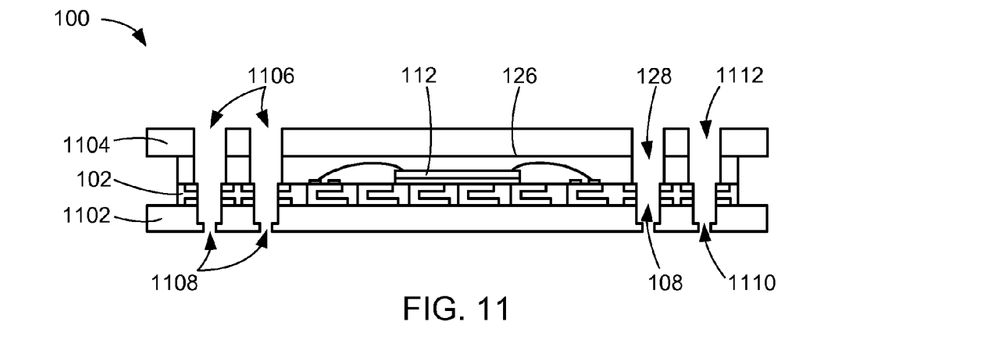
FIG. 11 is the structure of FIG. 10 in a stencil-providing phase.

Referring now to FIG. 11, therein is shown the structure of FIG. 10 in a stencil-providing phase. The integrated circuit packaging system 100 can include a support plate 1102 and a stencil plate 1104.

The support plate 1102 is defined as a structure that holds the structure of FIG. 10 in a fixed position in a process of forming the interconnection structure 130 of FIG. 1. The stencil plate 1104 is defined as a structure that includes a stencil plate opening 1106 at the top of the stencil plate 1104 functioning as an inlet of a mold to allow or block the flow of a conductive material (not shown). The conductive material can be injected or filled into the stencil plate 1104 in the formation of the interconnection structure 130.

The support plate 1102 can include a support plate opening 1108 at the bottom of the support plate 1102. The support plate opening 1108 provides a vent for air to escape when the conductive material is injected leaving no air pocket or no air entrapment in the interconnection structure 130. The support plate 1102 can include a support plate cavity 1110 above the support plate opening 1108 defining a structure or a shape of the structure bottom terminal 134 of FIG. 1 before a reflow and curing process occurs. The support plate opening 1108 and the support plate cavity 1110 can be aligned directly under the base carrier hole 108.

The stencil plate 1104 can include a stencil plate cavity 1112 below the stencil plate opening 1106 defining a structure or a shape of the structure top terminal 136 of FIG. 1. The stencil plate opening 1106 and the stencil plate cavity 1112 can be aligned directly over the encapsulation hole 128.

After the conductive material is injected or filled through the stencil plate opening 1106 and completely into the stencil plate cavity 1112, the encapsulation hole 128, the base carrier hole 108, and the support plate cavity 1110, the reflow and curing process can occur to form the interconnection structure 130. The interconnection structure 130 can include a structure or a shape as previously described in FIGS. 1 and 3 after the reflow and curing process. For example, the interconnection structure 130 can include the bottom terminal external surface 306 of FIG. 3 and the top terminal external surface 310 of FIG. 3 having curve surfaces after reflow.

For example, the conductive material can represent an electrically conductive material including a metallic material or a metallic alloy. For a specific example, the conductive material can represent solder or a conductive paste.

The interconnection structure 130 can provide an electrical interconnection structure connected between the base integrated circuit 112 and the external system or a stack semiconductor package with the interconnection structure 130 having extruded terminals, depicted as the structure bottom terminal 134 of FIG. 1 and the structure top terminal 136 of FIG. 1, in package level for package-on-package (PoP). For example, locations or positions of the extruded terminals can correspond to ball pads of a semiconductor package that is to be stacked over the interconnection structure 130.

The interconnection structure 130 can be formed with one time process to fill the conductive material through holes, some of which are depicted as the encapsulation hole 128 and the base carrier hole 108. The conductive material can be filled one time with a simple process all the way from a mold surface, depicted as the encapsulation top side 126, to a printed circuit board (PCB) substrate, depicted as the base carrier 102, with the conductive material and form the extruded terminals for the subsequent package stacking.

Figure 12:
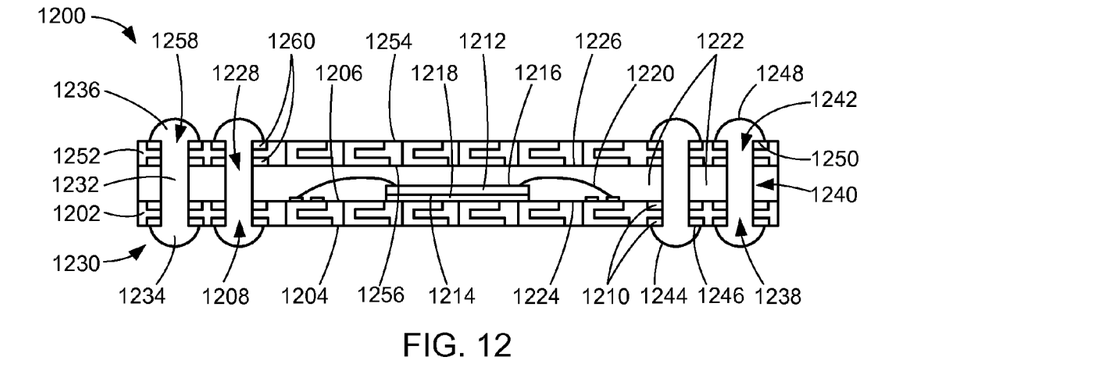
FIG. 12 is a cross-sectional view of an integrated circuit packaging system in a second embodiment of the present invention.

Referring now to FIG. 12, therein is shown a cross-sectional view of an integrated circuit packaging system 1200 in a second embodiment of the present invention. In a manner same as the integrated circuit packaging system 100 of FIG. 1, the integrated circuit packaging system 1200 includes a base carrier 1202 having a base carrier interconnection side 1204, a base carrier device side 1206, a base carrier hole 1208, and base carrier pads 1210.

In a manner same as the integrated circuit packaging system 100, the integrated circuit packaging system 1200 includes a base integrated circuit 1212 having a base inactive side 1214 and a base active side 1216. In a manner same as the integrated circuit packaging system 100, the integrated circuit packaging system 1200 includes a base attach layer 1218 and a base connector 1220. In a manner same as the integrated circuit packaging system 100, the integrated circuit packaging system 1200 includes an encapsulation 1222 having an encapsulation bottom side 1224, an encapsulation top side 1226, and an encapsulation hole 1228.

In a manner similar to the integrated circuit packaging system 100, the integrated circuit packaging system 1200 includes an interconnection structure 1230 having a structure central portion 1232, a structure bottom terminal 1234, and a structure top terminal 1236. In a manner same as the integrated circuit packaging system 100, the structure central portion 1232 includes a structure lower portion 1238 and a structure internal portion 1240. The structure central portion 1232 also includes a structure upper portion 1242, which is defined as a top portion of the structure central portion 1232.

In a manner same as the integrated circuit packaging system 100, the structure bottom terminal 1234 includes a bottom terminal external surface 1244 and a bottom terminal planar side 1246. In a manner same as the integrated circuit packaging system 100, the structure top terminal 1236 includes a top terminal external surface 1248 and a top terminal planar side 1250.

The integrated circuit packaging system 1200 can include a stack carrier 1252, which is defined as a support structure for mounting and connecting a semiconductor package thereto including providing electrical connections through the support structure. The stack carrier 1252 can be mounted over the base integrated circuit 1212. As an example, the stack carrier 1252 can represent a support structure including a multi-layer support structure including a printed circuit board (PCB), an interposer, a laminated substrate, or a ceramic substrate.

The stack carrier 1252 can include a stack carrier interconnection side 1254 and a stack carrier device side 1256 opposite the stack carrier interconnection side 1254. The stack carrier interconnection side 1254 and the stack carrier device side 1256 are defined as horizontal surfaces of the stack carrier 1252, having opposite orientation, that are connected to an external system (not shown) and a semiconductor device, respectively.

The stack carrier device side 1256 can be covered by the encapsulation 1222. The stack carrier device side 1256 can face the base carrier device side 1206.

The stack carrier 1252 can include a stack carrier hole 1258, which is defined as a through opening in the stack carrier 1252, from the stack carrier interconnection side 1254 to the stack carrier device side 1256. The stack carrier hole 1258 can be directly over as well as concentric with the encapsulation hole 1228 and the base carrier hole 1208. For example, the stack carrier hole 1258 can represent a hole in a printed circuit board (PCB).

The stack carrier 1252 can include stack carrier pads 1260, which are defined as electrically conductive contacts. The stack carrier pads 1260 provide attachment sites to electrically connect the stack carrier 1252 to a semiconductor device, a semiconductor package, or the external system. The stack carrier pads 1260 can be provided at the stack carrier interconnection side 1254 and the stack carrier device side 1256.

The interconnection structure 1230 can include the structure central portion 1232 having the structure lower portion 1238, the structure internal portion 1240, and the structure upper portion 1242 that are integrally formed. The structure lower portion 1238 and the structure upper portion 1242 are electrically connected to the structure bottom terminal 1234 and the structure top terminal 1236, respectively.

The structure top terminal 1236 can include the top terminal planar side 1250 connected to the top terminal external surface 1248 and a non-horizontal side of the structure upper portion 1242. The structure upper portion 1242 can be through or within the stack carrier hole 1258.

For illustration purposes, the structure lower portion 1238, the structure internal portion 1240, and the structure upper portion 1242 are shown having approximately the same horizontal width, although it is understood that the structure lower portion 1238, the structure internal portion 1240, and the structure upper portion 1242 can have any widths. For example, the structure internal portion 1240 can include a horizontal width greater than a horizontal width of the structure lower portion 1238 or a horizontal width of the structure upper portion 1242.

The structure top terminal 1236 is extruded from the stack carrier 1252 for subsequent package stacking and electrical connection. The structure top terminal 1236 can extend from or above the stack carrier interconnection side 1254. A portion of the structure top terminal 1236 can be directly on and electrically coupled to one of the stack carrier pads 1260 at the stack carrier interconnection side 1254.

Multiple substrates, depicted as the base carrier 1202 and the stack carrier 1252, can be integrated during one molding process sharing same terminals, depicted as the interconnection structure 1230 having the structure bottom terminal 1234 and the structure top terminal 1236. The terminals can be out of or extending beyond pads in each substrate, depicted as the base carrier pads 1210 of the base carrier 1202 and the stack carrier pads 1260 of the stack carrier 1252.

It has been discovered that the interconnection structure 1230 having a single integral structure with the structure central portion 1232, the structure bottom terminal 1234, and the structure top terminal 1236 eliminate contamination and thus environmentally friendly with a simple process for molded package-on-package (PoP) packages compared to molded laser package-on-package (MLP) packages, which require multiple and separate processes to form top and bottom terminals producing undesirable by-product like dust.

It has been unexpectedly found that the structure central portion 1232 with a robust vertical structure through the base carrier hole 1208, the encapsulation hole 1228, and the stack carrier hole 1258 provide structural integrity resulting in improved reliability.

It has been unexpectedly determined that the interconnection structure 1230 having the structure central portion 1232, the structure bottom terminal 1234, and the structure top terminal 1236 provides ball pad pitch reduction and thus overall package size reduction.

It has been unexpectedly recognized that the structure bottom terminal 1234 and the structure top terminal 1236 integral to the structure central portion 1232 improves electrical performance with less propagation delay by achieving direct interconnection between one of the base carrier pads 1210 at the base carrier interconnection side 1204 and another of the base carrier pads 1210 at the base carrier device side 1206 without additional processes to form via on pad or dog-bone patterns in substrate fabrication.

It has been unexpectedly ascertained that the structure internal portion 1240 having a horizontal width greater than a horizontal width of the structure lower portion 1238 or a horizontal width of the structure upper portion 1242 provides structural rigidity as well as eliminates mold bleeding into the base carrier hole 1208 in the formation of the encapsulation 1222.

It has been unexpectedly identified that the structure bottom terminal 1234 and the structure top terminal 1236 having vertical heights less than heights or diameters of solder balls on top pads of current package-on-package (PoP) packages provide package height profile reduction, thereby providing solutions for package size and height requirements in technology for package stack or package-on-package (PoP).

Figure 13:
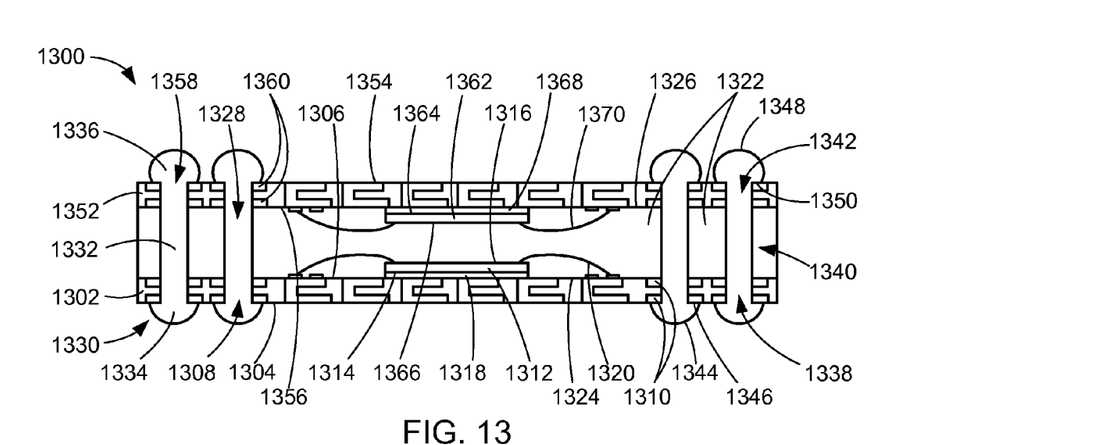
FIG. 13 is a cross-sectional view of an integrated circuit packaging system in a third embodiment of the present invention.

Referring now to FIG. 13, therein is shown a cross-sectional view of an integrated circuit packaging system 1300 in a third embodiment of the present invention. In a manner same as the integrated circuit packaging system 100 of FIG. 1, the integrated circuit packaging system 1300 includes a base carrier 1302 having a base carrier interconnection side 1304, a base carrier device side 1306, a base carrier hole 1308, and base carrier pads 1310.

In a manner same as the integrated circuit packaging system 100, the integrated circuit packaging system 1300 includes a base integrated circuit 1312 having a base inactive side 1314 and a base active side 1316. In a manner same as the integrated circuit packaging system 100, the integrated circuit packaging system 1300 includes a base attach layer 1318 and a base connector 1320. In a manner same as the integrated circuit packaging system 100, the integrated circuit packaging system 1300 includes an encapsulation 1322 having an encapsulation bottom side 1324, an encapsulation top side 1326, and an encapsulation hole 1328.

In a manner similar to the integrated circuit packaging system 100, the integrated circuit packaging system 1300 includes an interconnection structure 1330 having a structure central portion 1332, a structure bottom terminal 1334, and a structure top terminal 1336. In a manner same as the integrated circuit packaging system 100, the structure central portion 1332 includes a structure lower portion 1338 and a structure internal portion 1340. The structure central portion 1332 also includes a structure upper portion 1342, which is defined as a top portion of the structure central portion 1332.

In a manner same as the integrated circuit packaging system 100, the structure bottom terminal 1334 includes a bottom terminal external surface 1344 and a bottom terminal planar side 1346. In a manner same as the integrated circuit packaging system 100, the structure top terminal 1336 includes a top terminal external surface 1348 and a top terminal planar side 1350.

The integrated circuit packaging system 1300 can include a stack carrier 1352, which is defined as a support structure for mounting and connecting a semiconductor package thereto including providing electrical connections through the support structure. The stack carrier 1352 can be mounted over the base integrated circuit 1312. As an example, the stack carrier 1352 can represent a support structure including a multi-layer support structure including a printed circuit board (PCB), an interposer, a laminated substrate, or a ceramic substrate.

The stack carrier 1352 can include a stack carrier interconnection side 1354 and a stack carrier device side 1356 opposite the stack carrier interconnection side 1354. The stack carrier interconnection side 1354 and the stack carrier device side 1356 are defined as horizontal surfaces of the stack carrier 1352, having opposite orientation, that are connected to an external system (not shown) and a semiconductor device, respectively.

The stack carrier device side 1356 can be covered by the encapsulation 1322. The stack carrier device side 1356 can face the base carrier device side 1306.

The stack carrier 1352 can include a stack carrier hole 1358, which is defined as a through opening in the stack carrier 1352, from the stack carrier interconnection side 1354 to the stack carrier device side 1356. The stack carrier hole 1358 can be directly over as well as concentric with the encapsulation hole 1328 and the base carrier hole 1308. For example, the stack carrier hole 1358 can represent a hole in a printed circuit board (PCB).

The stack carrier 1352 can include stack carrier pads 1360, which are defined as electrically conductive contacts. The stack carrier pads 1360 provide attachment sites to electrically connect the stack carrier 1352 to a semiconductor device, a semiconductor package, or the external system. The stack carrier pads 1360 can be provided at the stack carrier interconnection side 1354 and the stack carrier device side 1356.

The interconnection structure 1330 can include the structure central portion 1332 having the structure lower portion 1338, the structure internal portion 1340, and the structure upper portion 1342 that are integrally formed. The structure lower portion 1338 and the structure upper portion 1342 are electrically connected to the structure bottom terminal 1334 and the structure top terminal 1336, respectively.

The structure top terminal 1336 can include the top terminal planar side 1350 connected to the top terminal external surface 1348 and a non-horizontal side of the structure upper portion 1342. The structure upper portion 1342 can be through or within the stack carrier hole 1358.

For illustration purposes, the structure lower portion 1338, the structure internal portion 1340, and the structure upper portion 1342 are shown having approximately the same horizontal width, although it is understood that the structure lower portion 1338, the structure internal portion 1340, and the structure upper portion 1342 can have any widths. For example, the structure internal portion 1340 can include a horizontal width greater than a horizontal width of the structure lower portion 1338 or a horizontal width of the structure upper portion 1342.

The structure top terminal 1336 is extruded from the stack carrier 1352 for subsequent package stacking and electrical connection. The structure top terminal 1336 can extend from or above the stack carrier interconnection side 1354. A portion of the structure top terminal 1336 can be directly on and electrically coupled to one of the stack carrier pads 1360 at the stack carrier interconnection side 1354.

Multiple substrates, depicted as the base carrier 1302 and the stack carrier 1352, can be integrated during one molding process sharing same terminals, depicted as the interconnection structure 1330 having the structure bottom terminal 1334 and the structure top terminal 1336. The terminals can be out of or extending beyond pads in each substrate, depicted as the base carrier pads 1310 of the base carrier 1302 and the stack carrier pads 1360 of the stack carrier 1352.

The integrated circuit packaging system 1300 can include a stack integrated circuit 1362, which is defined as a semiconductor device having a number of integrated transistors interconnected to form active circuits. For example, the stack integrated circuit 1362 can represent a semiconductor device including an integrated circuit die, a wirebond integrated circuit, or a flip chip.

The stack integrated circuit 1362 can include a stack inactive side 1364 and a stack active side 1366 opposite the stack inactive side 1364. The stack active side 1366 is defined as a side of the stack integrated circuit 1362 having active circuitry fabricated thereon or having elements for connection to the active circuitry within the stack integrated circuit 1362.

The integrated circuit packaging system 1300 can include a stack attach layer 1368, which is defined as a structure for holding a semiconductor device to a carrier. For example, the stack attach layer 1368 can be a die attach material or an adhesive material. The stack attach layer 1368 can be attached to the stack carrier device side 1356 and the stack inactive side 1364.

The integrated circuit packaging system 1300 can include a stack connector 1370, which is defined as an electrically conductive connector. The stack connector 1370 can be coupled or attached to the stack carrier device side 1356 and the stack active side 1366.

The stack integrated circuit 1362 can be electrically connected to the interconnection structure 1330 with the interconnection structure 1330 connected to the stack carrier pads 1360 and with the stack connector 1370 connected to the stack integrated circuit 1362 and the stack carrier 1352. The encapsulation 1322 can be formed over and covering the stack integrated circuit 1362, the stack carrier device side 1356, the stack attach layer 1368, and the stack connector 1370.

It has been discovered that the interconnection structure 1330 having a single integral structure with the structure central portion 1332, the structure bottom terminal 1334, and the structure top terminal 1336 eliminate contamination and thus environmentally friendly with a simple process for molded package-on-package (PoP) packages compared to molded laser package-on-package (MLP) packages, which require multiple and separate processes to form top and bottom terminals producing undesirable by-product like dust.

It has been unexpectedly found that the structure central portion 1332 with a robust vertical structure through the base carrier hole 1308, the encapsulation hole 1328, and the stack carrier hole 1358 provide structural integrity resulting in improved reliability.

It has been unexpectedly determined that the interconnection structure 1330 having the structure central portion 1332, the structure bottom terminal 1334, and the structure top terminal 1336 provides ball pad pitch reduction and thus overall package size reduction.

It has been unexpectedly recognized that the structure bottom terminal 1334 and the structure top terminal 1336 integral to the structure central portion 1332 improves electrical performance with less propagation delay by achieving direct interconnection between one of the base carrier pads 1310 at the base carrier interconnection side 1304 and another of the base carrier pads 1310 at the base carrier device side 1306 without additional processes to form via on pad or dog-bone patterns in substrate fabrication.

It has been unexpectedly ascertained that the structure internal portion 1340 having a horizontal width greater than a horizontal width of the structure lower portion 1338 or a horizontal width of the structure upper portion 1342 provides structural rigidity as well as eliminates mold bleeding into the base carrier hole 1308 in the formation of the encapsulation 1322.

It has been unexpectedly identified that the structure bottom terminal 1334 and the structure top terminal 1336 having vertical heights less than heights or diameters of solder balls on top pads of current package-on-package (PoP) packages provide package height profile reduction, thereby providing solutions for package size and height requirements in technology for package stack or package-on-package (PoP).

Figure 14:
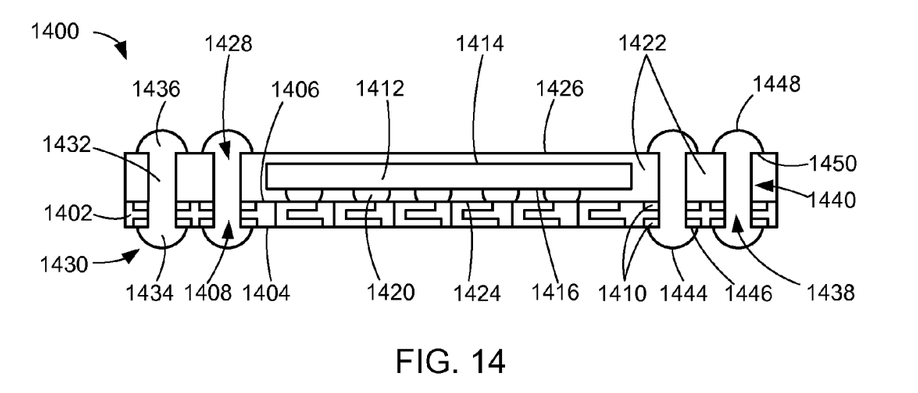
FIG. 14 is a cross-sectional view of an integrated circuit packaging system in a fourth embodiment of the present invention.

Referring now to FIG. 14, therein is shown a cross-sectional view of an integrated circuit packaging system 1400 in a fourth embodiment of the present invention. In a manner same as the integrated circuit packaging system 100 of FIG. 1, the integrated circuit packaging system 1400 includes a base carrier 1402 having a base carrier interconnection side 1404, a base carrier device side 1406, a base carrier hole 1408, and base carrier pads 1410.

In a manner similar to the integrated circuit packaging system 100, the integrated circuit packaging system 1400 includes a base integrated circuit 1412 having a base inactive side 1414 and a base active side 1416. In a manner similar to the integrated circuit packaging system 100, the integrated circuit packaging system 1400 includes a base connector 1420. In a manner same as the integrated circuit packaging system 100, the integrated circuit packaging system 1400 includes an encapsulation 1422 having an encapsulation bottom side 1424, an encapsulation top side 1426, and an encapsulation hole 1428.

In a manner same as the integrated circuit packaging system 100, the integrated circuit packaging system 1400 includes an interconnection structure 1430 having a structure central portion 1432, a structure bottom terminal 1434, and a structure top terminal 1436. In a manner same as the integrated circuit packaging system 100, the structure central portion 1432 includes a structure lower portion 1438 and a structure internal portion 1440.

In a manner same as the integrated circuit packaging system 100, the structure bottom terminal 1434 includes a bottom terminal external surface 1444 and a bottom terminal planar side 1446. In a manner same as the integrated circuit packaging system 100, the structure top terminal 1436 includes a top terminal external surface 1448 and a top terminal planar side 1450.

The base integrated circuit 1412 can be mounted over the base carrier 1402 with the base active side 1416 downwardly facing the base carrier device side 1406. The base integrated circuit 1412 can be electrically coupled to the base carrier 1402 with the base connector 1420 connected or attached to the base carrier device side 1406 and the base active side 1416.

The base integrated circuit 1412 can be electrically connected to the interconnection structure 1430 with the interconnection structure 1430 connected to the base carrier pads 1410 and with the base connector 1420 connected to the base carrier device side 1406 and the base active side 1416. For example, the base integrated circuit 1412 can represent a flip chip or any other semiconductor device.

It has been discovered that the interconnection structure 1430 having the single integral structure with the structure central portion 1432, the structure bottom terminal 1434, and the structure top terminal 1436 eliminate contamination and thus environmentally friendly with a simple process for molded package-on-package (PoP) packages compared to molded laser package-on-package (MLP) packages, which require multiple and separate processes to form top and bottom terminals producing undesirable by-product like dust.

It has been unexpectedly found that the structure central portion 1432 with a robust vertical structure through the base carrier hole 1408 and the encapsulation hole 1428 provide structural integrity resulting in improved reliability.

It has been unexpectedly determined that the interconnection structure 1430 having the structure central portion 1432, the structure bottom terminal 1434, and the structure top terminal 1436 provides ball pad pitch reduction and thus overall package size reduction.

It has been unexpectedly recognized that the structure bottom terminal 1434 and the structure top terminal 1436 integral to the structure central portion 1432 improves electrical performance with less propagation delay by achieving direct interconnection between one of the base carrier pads 1410 at the base carrier interconnection side 1404 and another of the base carrier pads 1410 at the base carrier device side 1406 without additional processes to form via on pad or dog-bone patterns in substrate fabrication.

It has been unexpectedly ascertained that the structure internal portion 1440 having a horizontal width greater than a horizontal width of the structure lower portion 1438 provides structural rigidity as well as eliminates mold bleeding into the base carrier hole 1408 in the formation of the encapsulation 1422.

It has been unexpectedly identified that the structure bottom terminal 1434 and the structure top terminal 1436 having vertical heights less than heights or diameters of solder balls on top pads of current package-on-package (PoP) packages provide package height profile reduction, thereby providing solutions for package size and height requirements in technology for package stack or package-on-package (PoP).

Figure 15:
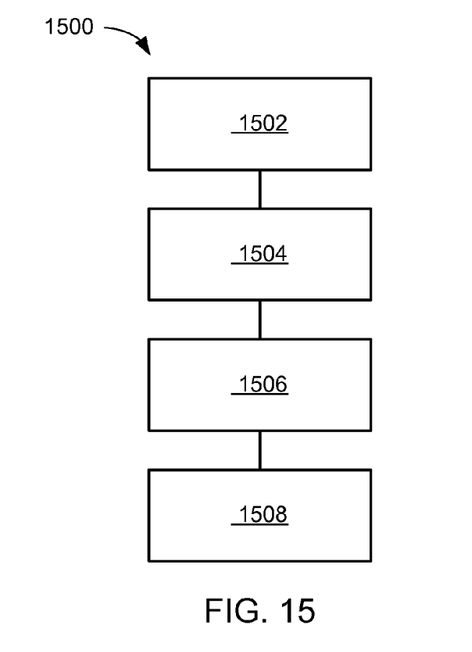
FIG. 15 is a flow chart of a method of manufacture of an integrated circuit packaging system in a further embodiment of the present invention.

Referring now to FIG. 15, therein is shown a flow chart of a method 1500 of manufacture of an integrated circuit packaging system in a further embodiment of the present invention. The method 1500 includes: providing a base carrier having a base carrier hole from a base carrier interconnection side to a base carrier device side in a block 1502; mounting a base integrated circuit over the base carrier in a block 1504; forming an encapsulation over the base carrier covering the base integrated circuit, the encapsulation having an encapsulation top side and having an encapsulation hole directly over the base carrier hole in a block 1506; and forming an interconnection structure as a single integral structure through the base carrier hole and the encapsulation hole, the interconnection structure directly on the encapsulation top side and directly on the base carrier interconnection side in a block 1508.

Thus, it has been discovered that the integrated circuit packaging system of the present invention furnishes important and heretofore unknown and unavailable solutions, capabilities, and functional aspects for an integrated circuit packaging system with interconnects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto set forth herein or shown in the accompanying drawings are to be interpreted in an illustrative and non-limiting sense.

What is claimed is:

1. A method of manufacture of an integrated circuit packaging system comprising:
   providing a base carrier having a base carrier hole from a base carrier interconnection side to a base carrier device side;
   mounting a base integrated circuit over the base carrier;
   forming an encapsulation over the base carrier covering the base integrated circuit, the encapsulation having an encapsulation top side and having an encapsulation hole directly over the base carrier hole; and
   forming an interconnection structure as a single integral structure through the base carrier hole and the encapsulation hole, the interconnection structure directly on the encapsulation top side and directly on the base carrier interconnection side.

2. The method of manufacturing an integrated circuit packaging system according to claim 1 wherein forming the interconnection structure includes forming the interconnection structure having a structure bottom terminal extending from the base carrier interconnection side.

3. The method of manufacturing an integrated circuit packaging system according to claim 1 further comprising mounting a stack carrier over the base integrated circuit, the stack carrier having a stack carrier hole with the interconnection structure within the stack carrier hole.

4. The method of manufacturing an integrated circuit packaging system according to claim 1 further comprising:
   mounting a stack carrier over the base integrated circuit, the stack carrier having a stack carrier pad; and wherein:
   forming the interconnection structure includes forming the interconnection structure having a structure top terminal directly on the stack carrier pad.

5. The method of manufacturing an integrated circuit packaging system according to claim 1 wherein mounting the base integrated circuit includes mounting the base integrated circuit over the base carrier, the base integrated circuit electrically connected to the interconnection structure.

6. A method of manufacture of an integrated circuit packaging system comprising:
provided a base carrier having a base carrier hole from a base carrier interconnection side to a base carrier device side;
mounting a base integrated circuit over the base carrier;
attaching a base attach layer to the base integrated circuit and the base carrier;
forming an encapsulation over the base carrier covering the base integrated circuit, the encapsulation having an encapsulation top side and having an encapsulation hole directly over the base carrier hole; and
forming an interconnection structure as a single integral structure through the base carrier hole and the encapsulation hole, the interconnection structure directly on the encapsulation top side and directly on the base carrier interconnection side.

7. The method of manufacturing an integrated circuit packaging system according to claim 6 wherein forming the interconnection structure includes forming the interconnection structure having a structure central portion and having a structure bottom terminal extending from the base carrier interconnection side, the structure bottom terminal having a horizontal width greater than a horizontal width of the structure central portion.

8. The method of manufacturing an integrated circuit packaging system according to claim 6 further comprising mounting a stack carrier over the base integrated circuit, the stack carrier having a stack carrier interconnection side and a stack carrier hole with the interconnection structure extending from the stack carrier interconnection side and within the stack carrier hole.

9. The method of manufacturing an integrated circuit packaging system according to claim 6 further comprising:
mounting a stack carrier over the base integrated circuit, the stack carrier having a stack carrier device side and a stack carrier pad; and
attaching a stack integrated circuit to the stack carrier device side, the stack integrated circuit electrically connected to the interconnection structure; and wherein:
forming the interconnection structure includes forming the interconnection structure having a structure top terminal directly on the stack carrier pad.

10. The method of manufacturing an integrated circuit packaging system according to claim 6 wherein mounting the base integrated circuit includes mounting a flip chip over the base carrier, the flip chip electrically connected to the interconnection structure.

11. An integrated circuit packaging system comprising:
a base carrier having a base carrier hole from a base carrier interconnection side to a base carrier device side;
a base integrated circuit over the base carrier;
an encapsulation over the base carrier covering the base integrated circuit, the encapsulation having an encapsulation top side and having an encapsulation hole directly over the base carrier hole; and
an interconnection structure as a single integral structure through the base carrier hole and the encapsulation hole, the interconnection structure directly on the encapsulation top side and directly on the base carrier interconnection side.

12. The integrated circuit packaging system according to claim 11 wherein the interconnection structure includes a structure bottom terminal extending from the base carrier interconnection side.

13. The integrated circuit packaging system according to claim 11 further comprising a stack carrier over the base integrated circuit, the stack carrier having a stack carrier hole with the interconnection structure within the stack carrier hole.

14. The integrated circuit packaging system according to claim 11 further comprising:
a stack carrier over the base integrated circuit, the stack carrier having a stack carrier pad; and wherein:
the interconnection structure includes a structure top terminal directly on the stack carrier pad.

15. The integrated circuit packaging system according to claim 11 wherein the base integrated circuit is over the base carrier and electrically connected to the interconnection structure.

16. The integrated circuit packaging system according to claim 11 further comprising a base attach layer attached to the base integrated circuit and the base carrier.

17. The integrated circuit packaging system according to claim 16 wherein the interconnection structure includes the interconnection structure having a structure central portion and having a structure bottom terminal extending from the base carrier interconnection side, the structure bottom terminal having a horizontal width greater than a horizontal width of the structure central portion.

18. The integrated circuit packaging system according to claim 16 further comprising a stack carrier over the base integrated circuit, the stack carrier having a stack carrier interconnection side and a stack carrier hole with the interconnection structure extending from the stack carrier interconnection side and within the stack carrier hole.

19. The integrated circuit packaging system according to claim 16 further comprising:
a stack carrier over the base integrated circuit, the stack carrier having a stack carrier device side and a stack carrier pad; and
a stack integrated circuit attached to the stack carrier device side, the stack integrated circuit electrically connected to the interconnection structure; and wherein:
the interconnection structure includes a structure top terminal directly on the stack carrier pad.

20. The integrated circuit packaging system according to claim 16 wherein the base integrated circuit is a flip chip over the base carrier, the flip chip electrically connected to the interconnection structure.

* * * * *